(12) United States Patent
Shao et al.

(10) Patent No.: US 10,535,645 B2
(45) Date of Patent: Jan. 14, 2020

(54) STITCHED DEVICES

(71) Applicant: GLOBALFOUNDRIES Singapore Pte. Ltd., Singapore (SG)

(72) Inventors: Wei Shao, Singapore (SG); Juan Boon Tan, Singapore (SG); Wei Liu, Wuhan (CN); Wanbing Yi, Singapore (SG)

(73) Assignee: ALSEPHINA INNOVATIONS INC., Ottawa (CA)

( * ) Notice: Subject to any disclaimer, the term of this patent is extended or adjusted under 35 U.S.C. 154(b) by 0 days.

(21) Appl. No.: 15/402,166

(22) Filed: Jan. 9, 2017

(65) Prior Publication Data

US 2017/0125396 A1 May 4, 2017

Related U.S. Application Data

(62) Division of application No. 14/715,538, filed on May 18, 2015, now Pat. No. 9,543,192.

(51) Int. Cl.

| | | |
|---|---|---|
| H01L 27/02 | (2006.01) | |
| H01L 21/48 | (2006.01) | |
| H01L 21/76 | (2006.01) | |
| H01L 23/49 | (2006.01) | |
| H01L 21/768 | (2006.01) | |
| H01L 23/528 | (2006.01) | |
| H01L 23/498 | (2006.01) | |
| H01L 23/522 | (2006.01) | |
| H01L 23/00 | (2006.01) | |
| H01L 25/065 | (2006.01) | |
| H01L 25/00 | (2006.01) | |

(52) U.S. Cl.
CPC ........ *H01L 27/0203* (2013.01); *H01L 21/486* (2013.01); *H01L 21/4857* (2013.01); *H01L 21/76801* (2013.01); *H01L 23/49822* (2013.01); *H01L 23/49827* (2013.01); *H01L 23/49833* (2013.01); *H01L 23/49838* (2013.01); *H01L 23/528* (2013.01); *H01L 23/5226* (2013.01); *H01L 24/24* (2013.01); *H01L 24/82* (2013.01); *H01L 25/0655* (2013.01); *H01L 25/50* (2013.01); *H01L 2224/24137* (2013.01); *H01L 2224/82895* (2013.01); *H01L 2924/14* (2013.01)

(58) Field of Classification Search
CPC ......... H01L 23/58; H01L 23/02; H01L 23/48; H01L 27/0203; H01L 21/4857; H01L 21/486; H01L 21/76801
USPC ................... 257/686, 770–774, 48, 692, 575
See application file for complete search history.

(56) References Cited

U.S. PATENT DOCUMENTS

| | | | |
|---|---|---|---|
| 6,301,121 B1 * | 10/2001 | Lin ..................... | H01L 23/5382 257/48 |
| 7,446,352 B2 * | 11/2008 | Becker ................ | H01L 27/0207 257/206 |
| 8,698,295 B2 | 4/2014 | Chia et al. | |

(Continued)

OTHER PUBLICATIONS

Yu, Dong C. H., "New System-In-Package (SiP) Integration Technologies", Proceedings of the IEEE 2014 Custom Integrated Circuits Conference, Sep. 2014, San Jose, CA, USA.

*Primary Examiner* — Sheikh Maruf
(74) *Attorney, Agent, or Firm* — Thompson Hine LLP

(57) ABSTRACT

A stitched device is disclosed. The stitched device includes first and second base devices having first and second stitched interconnects electrically coupled in a stitching level. This enables a single substrate of the stitched device to have electrically coupled first and second base devices.

14 Claims, 11 Drawing Sheets

(56) References Cited

U.S. PATENT DOCUMENTS

| | | | |
|---|---|---|---|
| 8,704,364 B2 | 4/2014 | Banijamali | |
| 8,806,393 B1* | 8/2014 | Greco | G06F 17/5068 |
| | | | 716/52 |
| 8,957,512 B2 | 2/2015 | Hisamura | |
| 8,963,236 B2* | 2/2015 | Song | H01L 27/228 |
| | | | 257/334 |
| 9,547,034 B2 | 1/2017 | Camarota | |
| 9,653,410 B1* | 5/2017 | Holmes | H01L 23/552 |
| 2002/0061614 A1* | 5/2002 | Kling | H01L 21/768 |
| | | | 438/183 |
| 2004/0207078 A1* | 10/2004 | Su | H01L 22/34 |
| | | | 257/723 |
| 2006/0104413 A1* | 5/2006 | Ohmi | G03F 7/70291 |
| | | | 378/35 |
| 2007/0152327 A1* | 7/2007 | Chia | H01L 23/3114 |
| | | | 257/723 |
| 2007/0231966 A1* | 10/2007 | Egawa | H01L 21/76898 |
| | | | 438/114 |
| 2007/0278642 A1* | 12/2007 | Yamaguchi | H01L 25/105 |
| | | | 257/686 |
| 2008/0028359 A1* | 1/2008 | Blawid | H01L 27/0203 |
| | | | 257/773 |
| 2009/0057919 A1* | 3/2009 | Lin | H01L 25/0657 |
| | | | 257/777 |
| 2009/0174080 A1* | 7/2009 | Saito | H01L 21/763 |
| | | | 257/774 |
| 2009/0267238 A1* | 10/2009 | Joseph | H01L 23/49833 |
| | | | 257/777 |
| 2009/0278569 A1* | 11/2009 | Taoka | E21B 43/24 |
| | | | 326/101 |
| 2009/0283915 A1* | 11/2009 | Becker | H01L 23/528 |
| | | | 257/776 |
| 2010/0096725 A1* | 4/2010 | Shi | H01L 23/49822 |
| | | | 257/531 |
| 2010/0244208 A1* | 9/2010 | Pagaila | H01L 21/568 |
| | | | 257/659 |
| 2010/0327457 A1* | 12/2010 | Mabuchi | H01L 23/50 |
| | | | 257/773 |
| 2010/0330741 A1* | 12/2010 | Huang | H01L 23/3128 |
| | | | 438/107 |
| 2011/0027917 A1* | 2/2011 | Shinkawata | G03F 9/7084 |
| | | | 438/16 |
| 2011/0169171 A1* | 7/2011 | Marcoux | H01L 23/481 |
| | | | 257/774 |
| 2011/0180317 A1* | 7/2011 | Takahashi | H01L 23/147 |
| | | | 174/537 |
| 2012/0206889 A1* | 8/2012 | Norman | H01L 23/50 |
| | | | 361/761 |
| 2012/0299159 A1* | 11/2012 | Chen | G03F 7/70625 |
| | | | 257/620 |
| 2013/0252378 A1* | 9/2013 | Jeng | H01L 23/13 |
| | | | 438/107 |
| 2013/0333921 A1* | 12/2013 | Hisamura | H01L 21/4846 |
| | | | 174/250 |
| 2014/0035093 A1* | 2/2014 | Pincu | H01L 25/0657 |
| | | | 257/506 |
| 2014/0070423 A1* | 3/2014 | Woychik | H01L 23/49833 |
| | | | 257/774 |
| 2014/0077391 A1* | 3/2014 | Kikuchi | H01L 23/49827 |
| | | | 257/774 |
| 2014/0084459 A1* | 3/2014 | Yu | H01L 24/97 |
| | | | 257/737 |
| 2014/0151794 A1* | 6/2014 | Lotfi | H01L 23/4824 |
| | | | 257/337 |
| 2014/0175666 A1* | 6/2014 | Rahman | H01L 23/5384 |
| | | | 257/774 |
| 2014/0203397 A1* | 7/2014 | Yen | H01L 28/10 |
| | | | 257/531 |
| 2014/0264715 A1* | 9/2014 | Ranganathan | G06F 17/5077 |
| | | | 257/499 |
| 2014/0264734 A1* | 9/2014 | Luo | H01L 23/147 |
| | | | 257/531 |
| 2015/0362842 A1* | 12/2015 | Ogawa | G03F 7/70466 |
| | | | 355/67 |
| 2016/0155692 A1* | 6/2016 | Dosluoglu | H01L 23/49822 |
| | | | 257/379 |
| 2017/0148727 A1* | 5/2017 | Do | H01L 23/528 |

\* cited by examiner

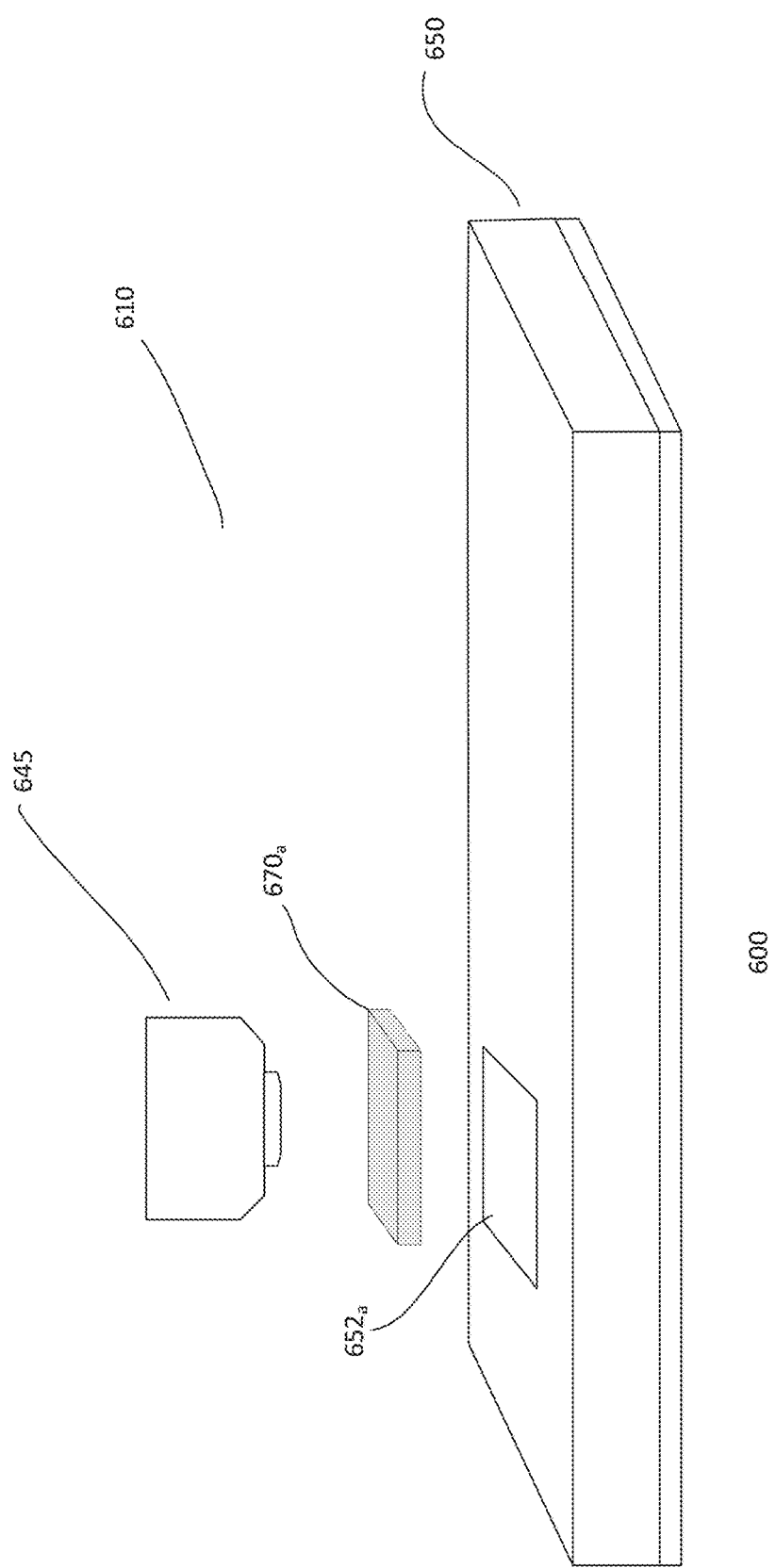

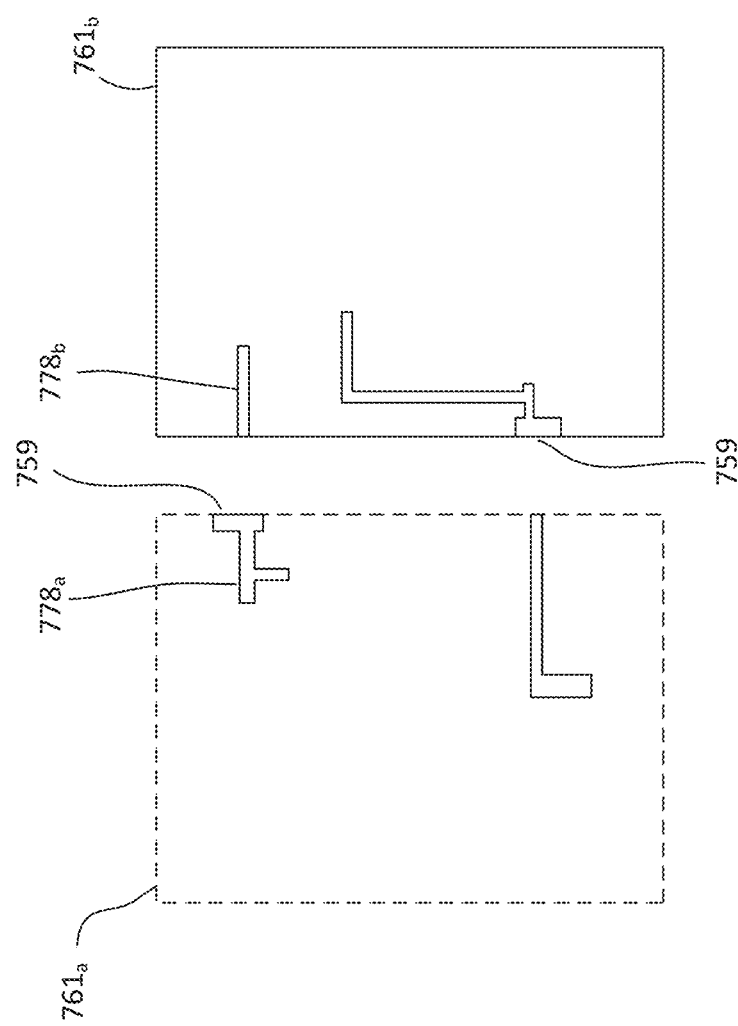

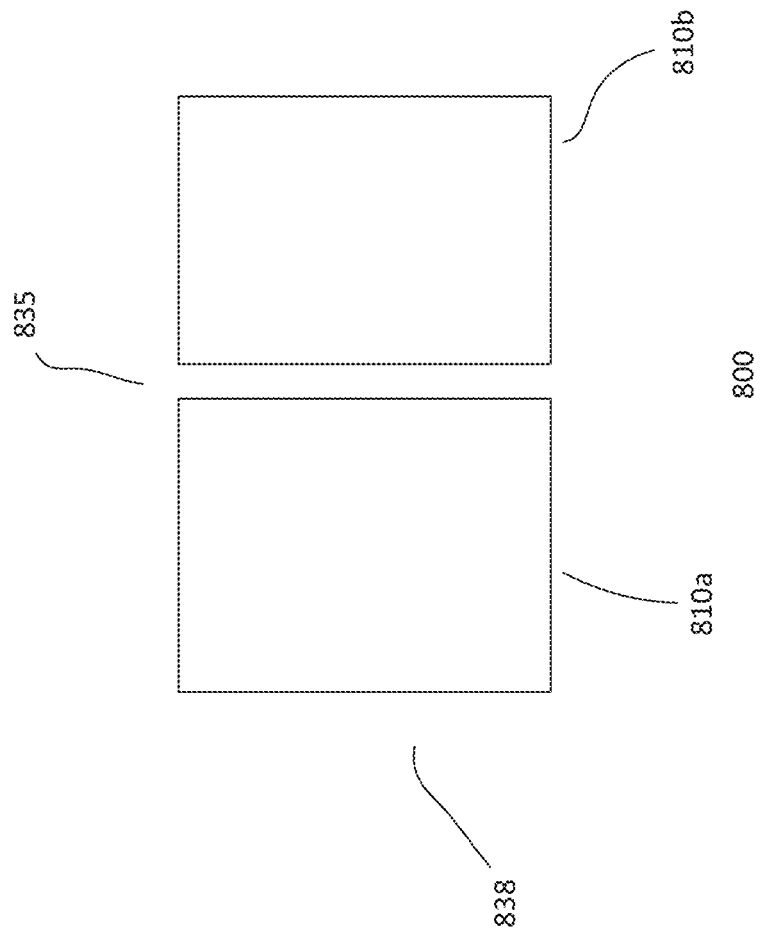

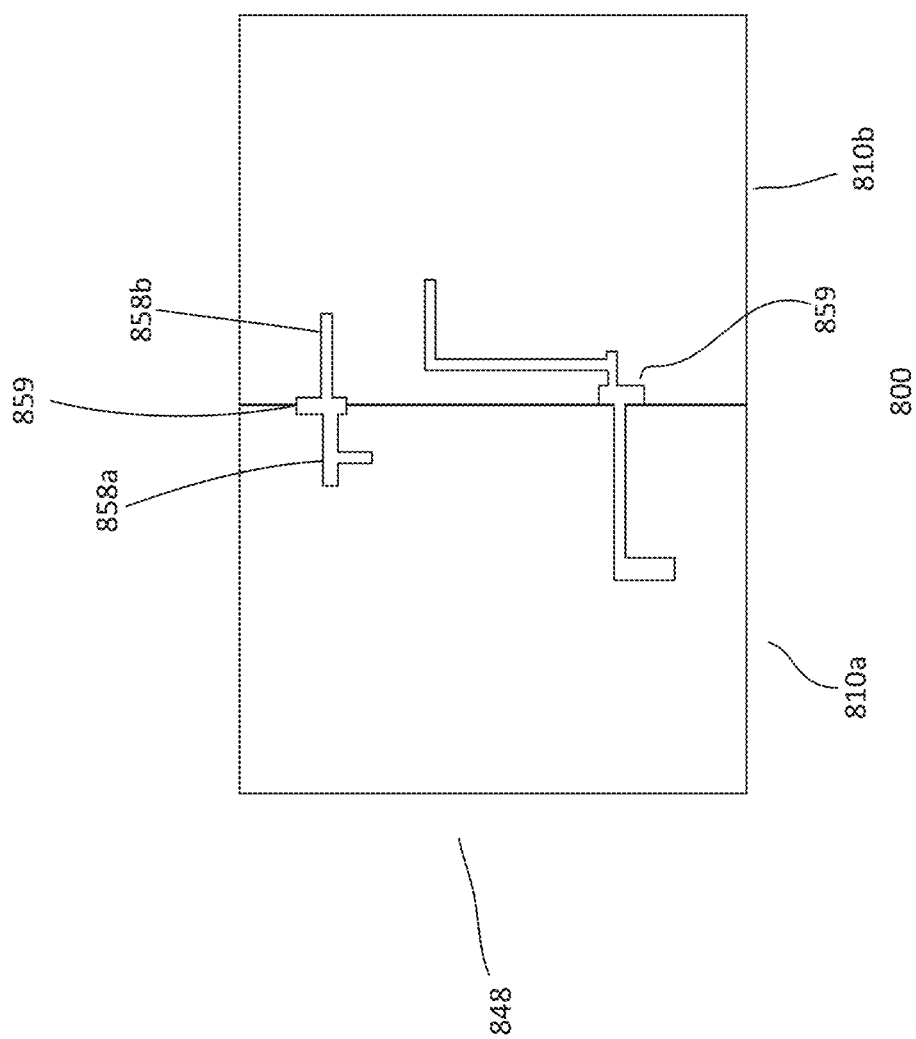

STITCHED DEVICES

CROSS-REFERENCE TO RELATED APPLICATION

This application is a divisional application which claims benefit of co-pending U.S. patent application Ser. No. 14/715,538, filed on May 18, 2015. All disclosures are incorporated herewith by reference.

BACKGROUND

As technology advances, there is a need to combine multiple chips into a device. Combining chips into a device, for example, requires an interposer with larger die size so as to allow more chips to be disposed on the interposer. The size of the die for use as an interposer, however, is limited by lithography tool hardware.

There is, therefore, a need to provide effective stitching of dies to reduce footprint, improve performance and reduce cost.

SUMMARY

Embodiments generally relate to semiconductor devices and methods for forming a semiconductor device. In one embodiment, a method of forming a stitched device is disclosed. The method includes providing a wafer having first and second major surfaces. The first major surface includes a photoresist layer. The first major surface includes a stitching level, which is an interconnect level of the stitched device. The stitching level is lithographically processed. The lithographic process includes exposing the photoresist layer with an exposure source using a first reticle for the stitching level of a first base device at a first position on the wafer. The first reticle includes a first interconnect pattern for first interconnects of a stitching level of the first base device. The photoresist layer is exposed with the exposure source using a second reticle for the stitching level of a second base device at a second position on the wafer. The second reticle includes a second interconnect pattern for second interconnects of a stitching level of the second base device. Adjacent sides of first and second patterns abut to form common sides of the first and second base devices. The first and second interconnect patterns include at least one stitching point for coupling a first stitched interconnect with a second stitched interconnect at the common sides. The wafer is processed to form first and second interconnects in the stitching levels of the first and second base devices. The first stitched interconnect is electrically coupled to the second stitched interconnect at the stitching point.

In another embodiment, a stitched device is disclosed. The stitched device includes a substrate with first and second base devices of the stitched device. The first and second base devices include common sides. The stitched device includes a stitching level, which is a common interconnect level of the base device. At least one stitching point is disposed along the common sides of the first and second base devices. The stitching point facilitates coupling of a first stitched interconnect with a second stitched interconnect at the common sides.

In yet another embodiment, a method of forming a stitched device is disclosed. The method includes providing a wafer having first and second major surfaces. The first major surface includes a photoresist layer. The first major surface includes a stitching level, which is an interconnect level of the stitched device. The stitching level is lithographically processed. The lithographic process includes exposing the photoresist layer with an exposure source using a first reticle for the stitching level of a first base device at a first position on the wafer. The first reticle includes a first interconnect pattern for first interconnects of a stitching level of the first base device. The photoresist layer is exposed with the exposure source using a second reticle for the stitching level of a second base device at a second position on the wafer. The second reticle includes a second interconnect pattern for second interconnects of a stitching level of the second base device. Adjacent sides of first and second patterns abut to form common sides of the first and second base devices. The first and second interconnect patterns include at least one stitching point for coupling a first stitched interconnect with a second stitched interconnect at the common sides. At least one of the first and second stitched interconnects at the stitching point includes stitch coupler which has a larger width than a width of the interconnects. The wafer is processed to form first and second interconnects in the stitching levels of the first and second base devices. The first stitched interconnect is electrically coupled to the second stitched interconnect at the stitching point.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following:

FIGS. 6a-6b illustrate a simplified lithographic process for forming a stitched device;

FIGS. 7a-7b illustrate a process for forming a stitched device; and

FIGS. 8a-8b show different layers of an embodiment of a stitched device.

DETAILED DESCRIPTION

Embodiments generally relate to devices, for example, semiconductor devices or integrated circuits (ICs). Other types of devices, such as interposers used for mounting ICs may also be useful. The devices, for example, are formed on a wafer using lithographic techniques. More particularly, embodiments relate to stitching dies or devices on a wafer using lithography. The devices or ICs can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

Figure 1:
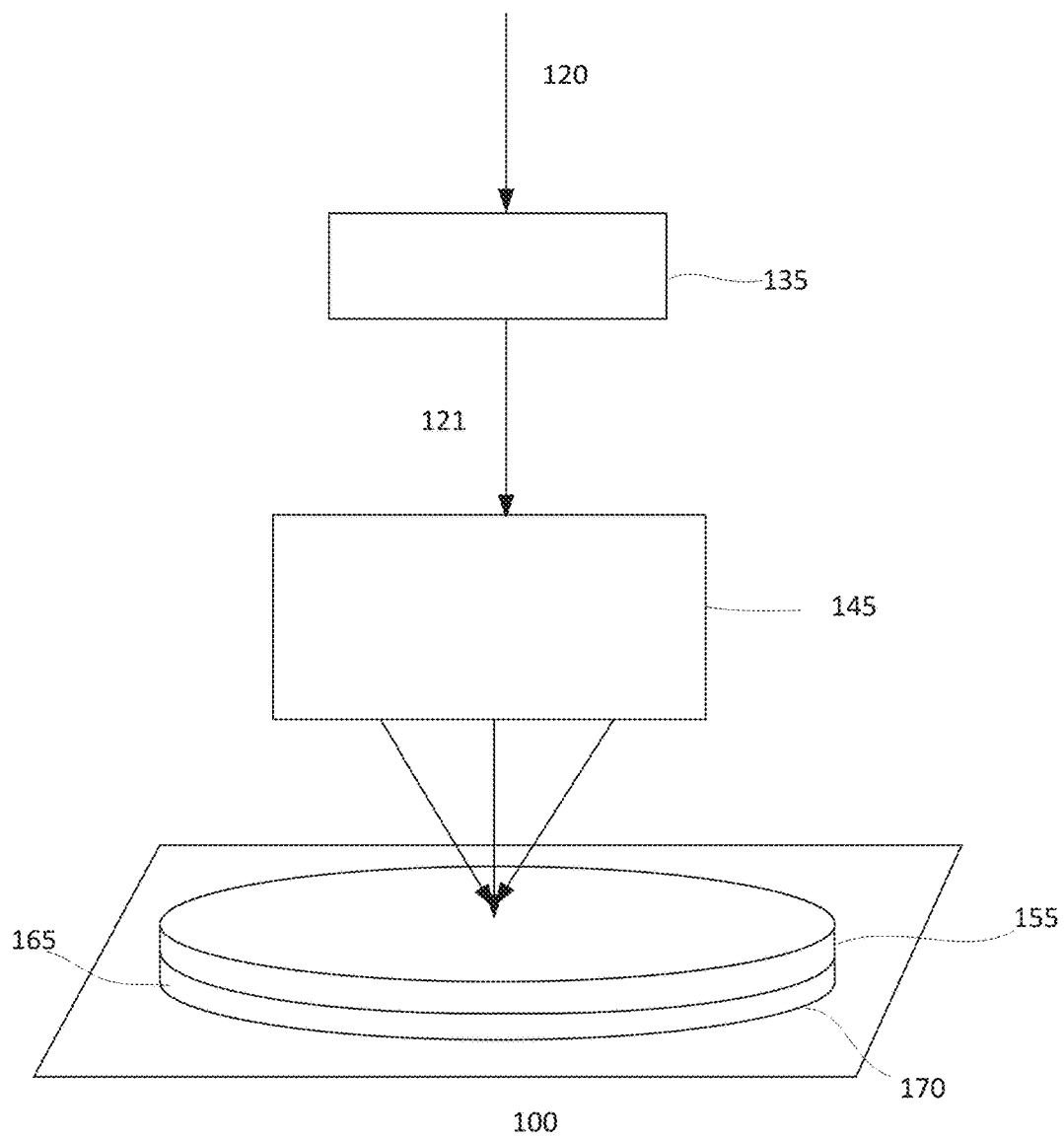
FIG. 1 shows a simplified diagram of a portion of an exemplary lithographic system.

FIG. 1 shows a simplified portion of an exemplary photolithography system 100 used for patterning a wafer to form features, such as circuit components. The photolithography system 100 may include exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam). The EMR operating beam 120 is passed through the illumination sub-system. The illumination sub-system, for example, may include mirrors and/or lenses. The illumination sub-system conducts the EMR operating beam 120 to a mask or reticle 135 having a desired pattern (e.g., mask pattern).

In one embodiment, the reticle 135 is a transmissive reticle. For example, the reticle 135 transmits the EMR operating beam 120 through it. The transmitted EMR beam 121 is a patterned beam having the pattern of the reticle 135. Other types of reticles, such as reflective reticles, can also be employed. For example, the reflective reticle reflects the EMR operating beam 120, creating a reflected patterned beam. In one embodiment, the perimeter and transmission rate of the reticle 135 were observed to have strong correlations to etch bias.

The patterned beam 121 is projected onto a wafer 165. In one embodiment, the wafer 165 is disposed on a translation stage 170. In one embodiment, the patterned beam 121 is projected onto the wafer by a projection sub-system 145. The projection sub-system 145 may include mirrors and/or lenses for projecting the patterned beam 121 onto a portion of the wafer 165. The wafer includes a photoresist or resist layer 155 which is exposed by the patterned beam 121. For example, the image of the patterned beam 121 is imaged onto the photoresist 155. The patterned beam 121 exposes a portion of the wafer 165 with the image of the reticle 135. The exposed portion corresponds to a device region on which a device is formed. After exposing the portion, the stage 170 may be translated to expose a next portion of the wafer 165. The exposure process repeats until the complete wafer 165 is exposed. Processing a wafer 165 using other types of lithographic or printing systems may also be useful.

After the wafer 165 has been exposed, the photoresist 155 is developed, transferring the pattern of the reticle 135 to the resist layer 155. An anti-reflective coating (ARC) may be provided beneath the resist layer 155 to improve lithographic resolution. The patterned resist layer 155 serves as an etch mask. For example, an anisotropic etch, such as a reactive ion etch (RIE), patterns the wafer 165 using the etch mask. Depending on the stage of process, the etch process may etch a bare wafer, a layer on the wafer, or multiple layers on the wafer 165. In the fabrication of an IC, numerous patterning processes utilizing different reticles may be performed. Similar but fewer patterning processes utilizing different reticles may be used to form interposers.

After processing of the wafer 165 is completed, the wafer 165 is diced along the dicing channel (or kerf) to produce individual dies. In the case of ICs, the wafer is diced to singulate stitched dies for packaging to form stitched chips. In some embodiments, wafer level packaging may be performed prior to dicing the wafer. Other configurations of packaging the ICs may also be useful. In the case of interposers, the wafer is diced to singulate the stitched die interposers.

Figure 2:
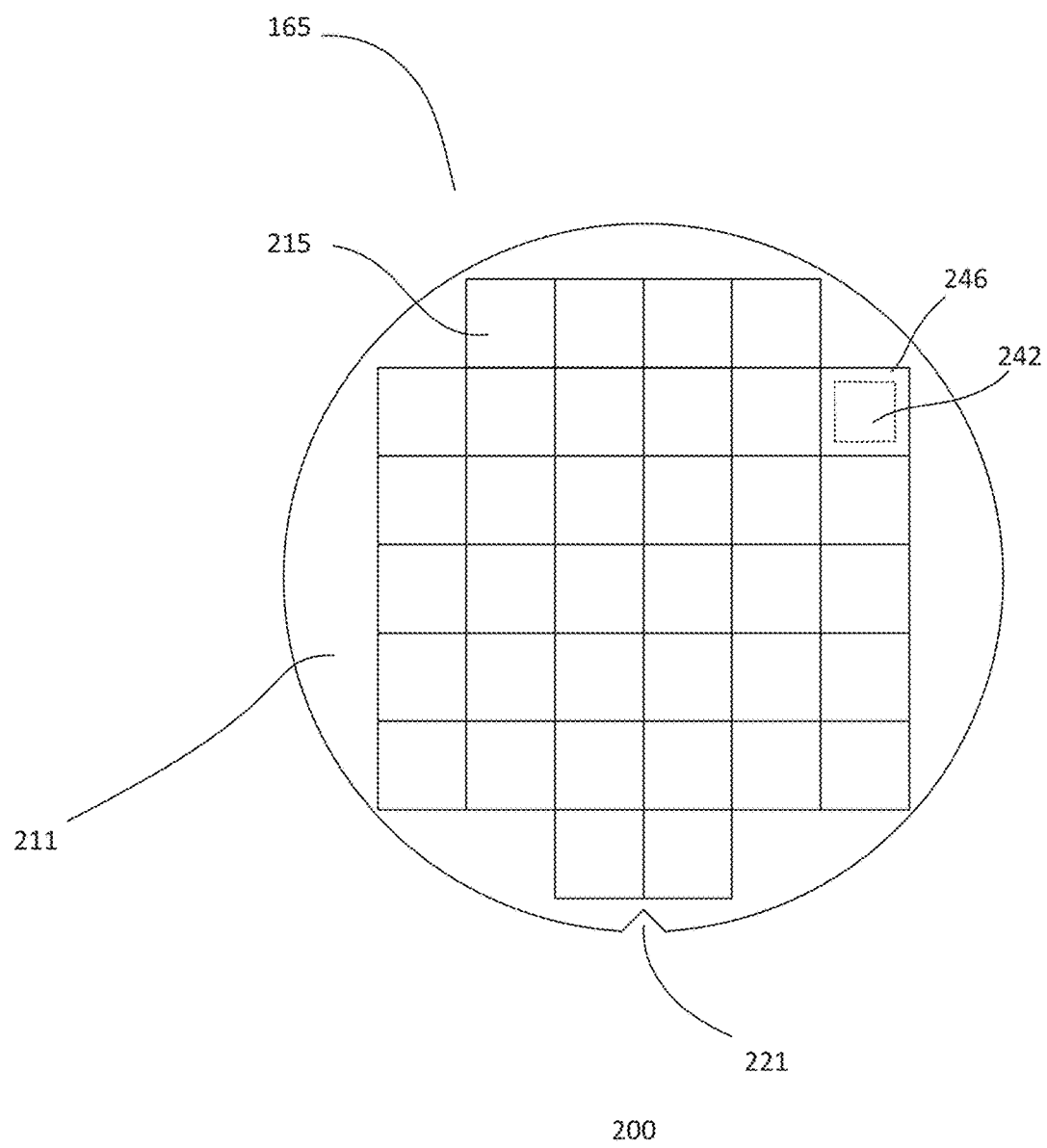
FIG. 2 shows a simplified plan view of a semiconductor wafer.

FIG. 2 shows a simplified plan view of an embodiment 200 of a semiconductor wafer 165. The semiconductor wafer 165, for example, may be a silicon wafer. Other types of wafers are also useful. For example, the wafer 165 may be a p-type, n-type, silicon-on-insulator (SOI) or silicon germanium wafer. The wafer 165 may include a notch 221 to indicate the crystal orientation of the wafer 165. Other techniques for indicating the crystal orientation may also be useful. Additional indicators may also be included to indicate the dopant type of the wafer.

The wafer includes an active surface 211 on which devices 215 are formed. A plurality of devices 215 may be formed on the wafer in parallel. The devices 215, for example, are arranged in rows along a first (x) direction and columns along a second (y) direction. A device includes a main device region 242 and a frame region 246. The main device region 242 includes features and interconnections of the device. As for the frame region 246, it surrounds the main device region 242. The frame region 246, for example, serves as dicing channels on the wafer 165, separating adjacent devices. The devices 215 are singulated by dicing the wafer along the dicing channels.

Figure 3:
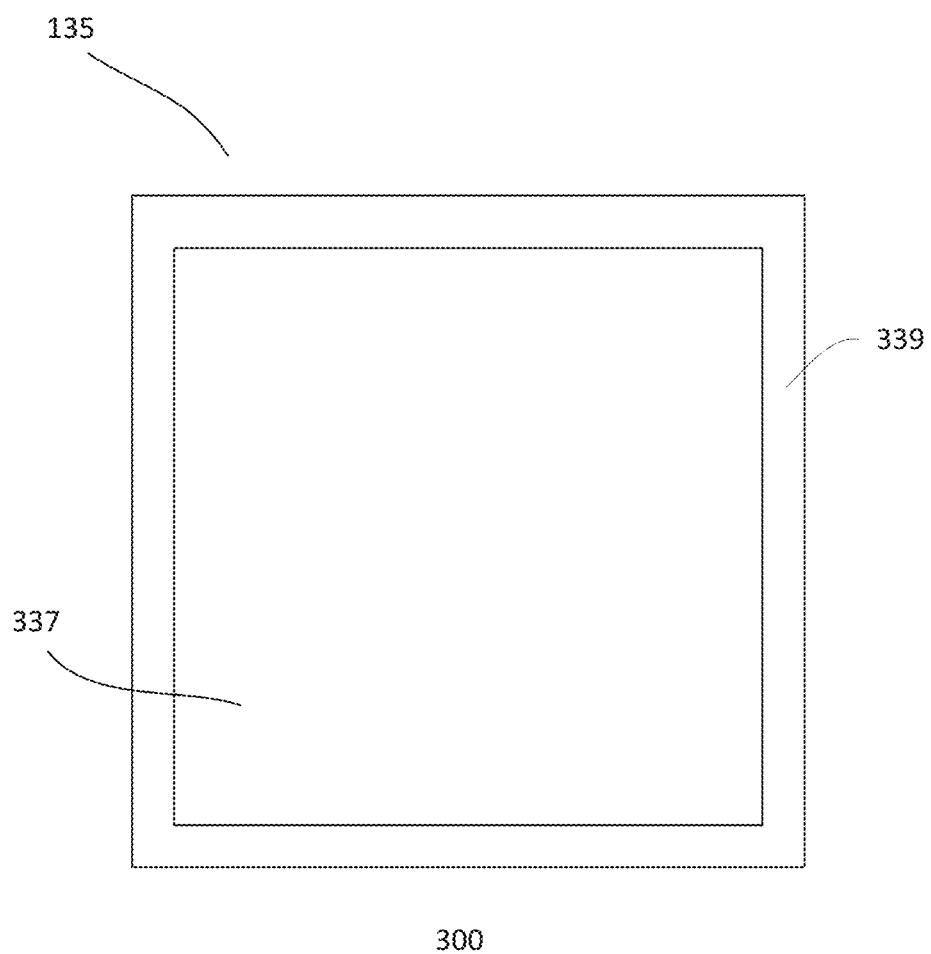
FIG. 3 shows an embodiment of a reticle used in exposing a wafer.

FIG. 3 shows an embodiment 300 of a reticle 135 used in exposing a wafer 165. The reticle 135 is, for example, a transmissive reticle. Other types of reticles may also be useful. As shown, the reticle 135 includes a prime or main region 337. The main region 337, for example, may be referred to as the device region. The main region 337 includes a pattern which, for example, corresponds to the pattern to be formed in the device. The main region 337 creates patterns of devices 215 in the main device regions 242 on the wafer 165. A frame region 339 surrounds the main region 337. The frame region 339, for example, corresponds to dicing channels 246 on the wafer 165. The frame region surrounds the device regions on the wafer. Dummy patterns may be provided in both the frame and main regions. In addition, test patterns may be provided in the frame region. Other configurations of the main and frame regions may also be useful. The reticle 135 is used to create desired patterns for respective levels on the device. In forming the device, numerous reticles may be employed.

As shown, a reticle includes a rectangular shape having width W and length L. The total area of the reticle is defined as W×L. The total area, for example, includes the area of the main and frame regions. For example, W is the total width and L is the total length of the reticle. Reticles of a mask set have the same sized reticles (e.g., same sized reticle area). Mask sets for different devices may have different sized reticles. For example, different devices may employ different sized reticles, which have different reticle area.

Figure 4:
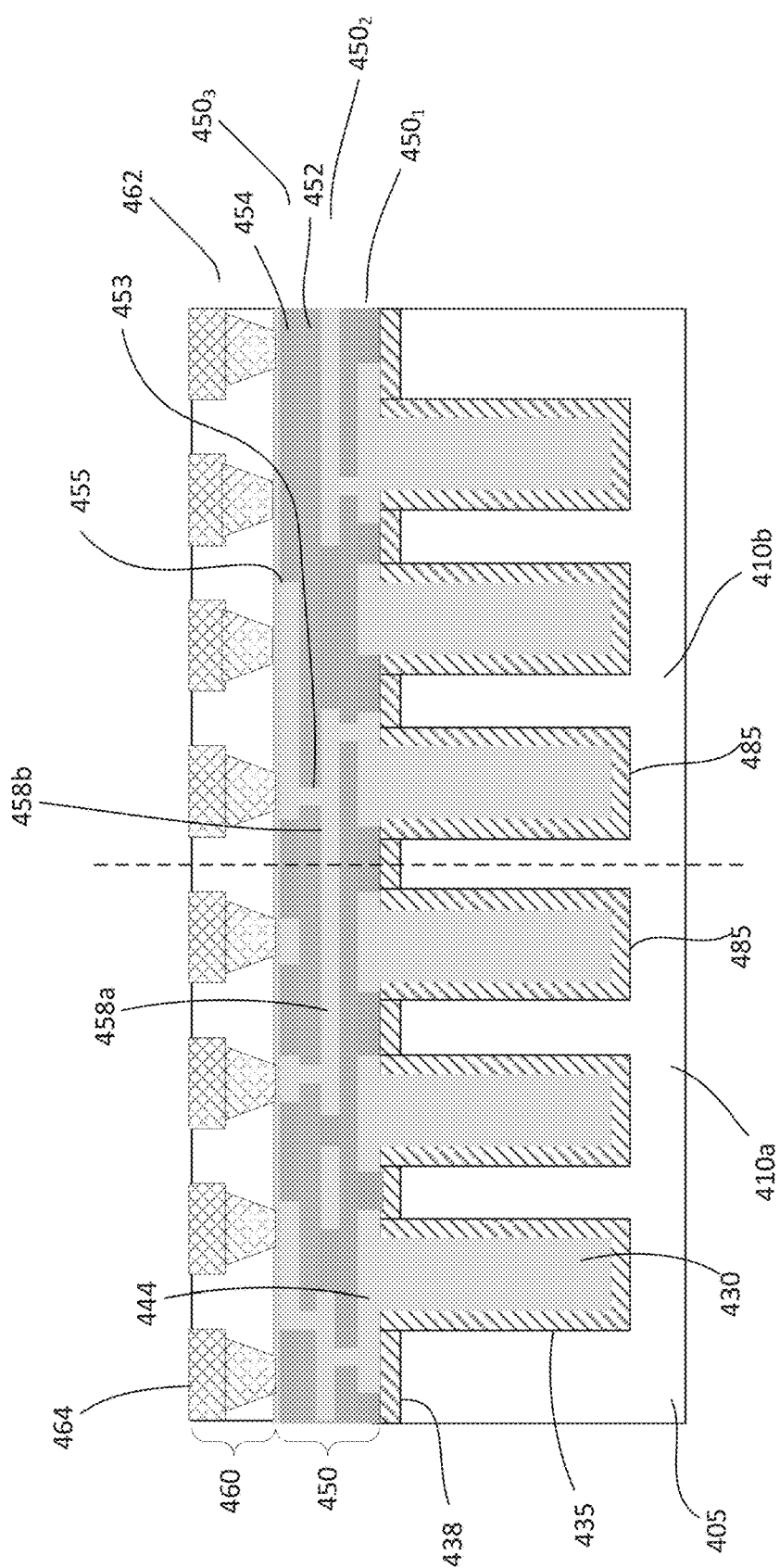
FIG. 4 shows an embodiment of a stitched device.

FIG. 4 shows a cross-sectional view of an embodiment of a portion of a device 400. In one embodiment, the device is a stitched device. The stitched device includes N number of base devices or dies. The based devices of the stitched device are formed by different lithographic processes and electrically coupled or stitched. In one embodiment, the stitched device includes a stitched interposer having N number of base interposers. A base interposer is used for mounting a chip, such as an IC. For example, a stitched interposer with N base interposers is used to mount N chips. As shown, the stitched interposer includes first and second base interposers 410a-410b for mounting first and second chips. Providing stitched interposers with other number of base interposers may also be useful. Other types of stitched devices, such as stitched ICs may also be useful.

The device includes a substrate 405. The substrate, for example, may be a silicon substrate. The substrate can be lightly doped with p-type dopants. Other suitable types of semiconductor substrates may also be used. For example, the substrate may be silicon germanium, intrinsic or doped with other types of dopants or dopant concentrations. The substrate may be a part of a wafer which is processed in parallel to form a plurality of stitched interposers. Forming other types of stitched devices may also be useful. The wafer may be diced to singulate the stitched devices.

The substrate includes first and second surfaces. The first surface may be the top surface on which an IC is mounted. In one embodiment, the substrate includes TSV contacts 430. The TSV contacts extend through the first surface of the substrate. The TSV contacts are, for example, copper TSV contacts. Other suitable types of conductive materials for the TSV contacts may also be useful. To provide electrical isolation from the substrate, the TSV contacts may be lined with a dielectric liner 435. The TSV contacts and liners are disposed in TSV trenches 485.

As shown, a dielectric liner layer 438 lines the surface of the substrate. In one embodiment, a top surface of the TSV contacts and dielectric liner is coplanar with a top surface of the dielectric layer. The dielectric liner layer may be a hard mask layer. The hard mask layer may be used to pattern the substrate to form the TSV trenches. The hard mask may be a silicon nitride or oxide hard mask. In one embodiment, the hard mask may include a hard mask stack. For example, the hard mask stack may include a pad oxide on the substrate and a silicon nitride layer thereon. Other suitable configurations of hard mask or hard mask stacks may also be useful. In other embodiments, the dielectric liner layer may be part of the liner which conformally lines the TSV trenches and substrate surface. Other configurations of the dielectric liner layer and liner may also be useful.

In one embodiment, a first surface of the substrate includes a redistribution layer (RDL) 450. The RDL, for example, is an interconnect level. The RDL may include a plurality of RDL levels or interconnect levels. For example, the RDL may include a base and upper levels. The base level serves as the bottom level which is in direct communication with the TSV contacts while upper levels are disposed over it. As shown, the RDL includes first, second and third levels $450_1$-$450_3$. The first level $450_1$, for example, is the bottom or base level. The bottom RDL level is disposed over the liner layer and TSV contact. In one embodiment, the bottom RDL level includes a dielectric layer, such as silicon oxide. Other suitable types of dielectric layers may also be useful. The bottom RDL level includes TSV contact pads 444. The TSV contact pads may be conductive islands. Contact pads which include conductive lines may also be useful. Other configurations of contact pads may also be useful. The TSV contact pads are coupled to the TSV contacts. The TSV contact pads may be copper TSV contact pads. Other suitable types of conductive contact pads may also be useful.

As shown, the upper RDL level includes first and second upper RDL levels $450_2$-$450_3$. The upper RDL level includes a RDL dielectric layer with interconnects having contacts 453 in a RDL via level 452 and conductive lines 455 in a RDL line level 454. The contacts and lines are, for example, copper contacts and lines formed by dual damascene technique. Other suitable techniques for forming the interconnects, such as the copper contacts and lines, or configurations of RDL levels may also be useful.

A pad level 460 is disposed over the RDL. For example, the pad level is disposed over the top of the upper RDL level. The pad level includes contact pads 464 disposed in a pad dielectric layer 462. The contact pads, for example, are aluminum contact pads. Other suitable types of contact pads may also be useful. The contact pads provide a basis of electrical connection for connecting to an IC which is mounted onto the interposer.

A back-grinding process may be performed on the second substrate surface to expose bottoms of the TSV contacts (not shown). Thereafter, the second substrate surface may be provided with interposer contacts. The interposer contacts, for example, include solder balls. Other suitable types of interposer contacts may also be useful. A dielectric layer may be provided on the second interposer surface after the back-grinding process to expose the TSV contacts. The dielectric layer, for example, includes openings exposing the bottom of the TSV contacts and facilitates in the formation of the interposer contacts.

The stitched device, as described, includes a plurality of base devices. The substrate of the stitched device is a single piece of material. The substrate, for example, is part of a wafer, such as a semiconductor wafer, which is used to form a plurality of stitched devices. For example, a single piece of the diced wafer serves as a common substrate for the base devices. The substrate of the stitched device is like a single die. The different base devices are processed using separate lithographic processes. For example, a common side of adjacent base devices is not diced, as in unstitched devices. For example, the dicing channel between adjacent devices is not diced or there is no dicing channel between adjacent base devices.

Adjacent base devices are electrically coupled or stitched at stitching points at a common side or edge, as indicated by the dotted line. As shown, interconnect 458a of the first base device and interconnect 458b from the second base device are electrically coupled at the stitching points on the common side of the base devices. In a stitched device, there may be numerous stitching points between base devices. In one embodiment, one of the two interconnects being stitched includes a stitch coupler to facilitate electrical connection between interconnects of the two base devices. The stitch coupler has an increased or larger width relative to the width of the other interconnect to be stitched. The width of the coupler may be about 2 to 6 times wider than the width of interconnect lines. Other widths may also be useful. The width may, for example, depend on the available dielectric area, design rules as well as reliability feasibility. Providing a stitch coupler increases the coupling process window between interconnects of base devices at the stitching point. In a stitched device, there may be numerous stitching points between base devices.

Figure 5:
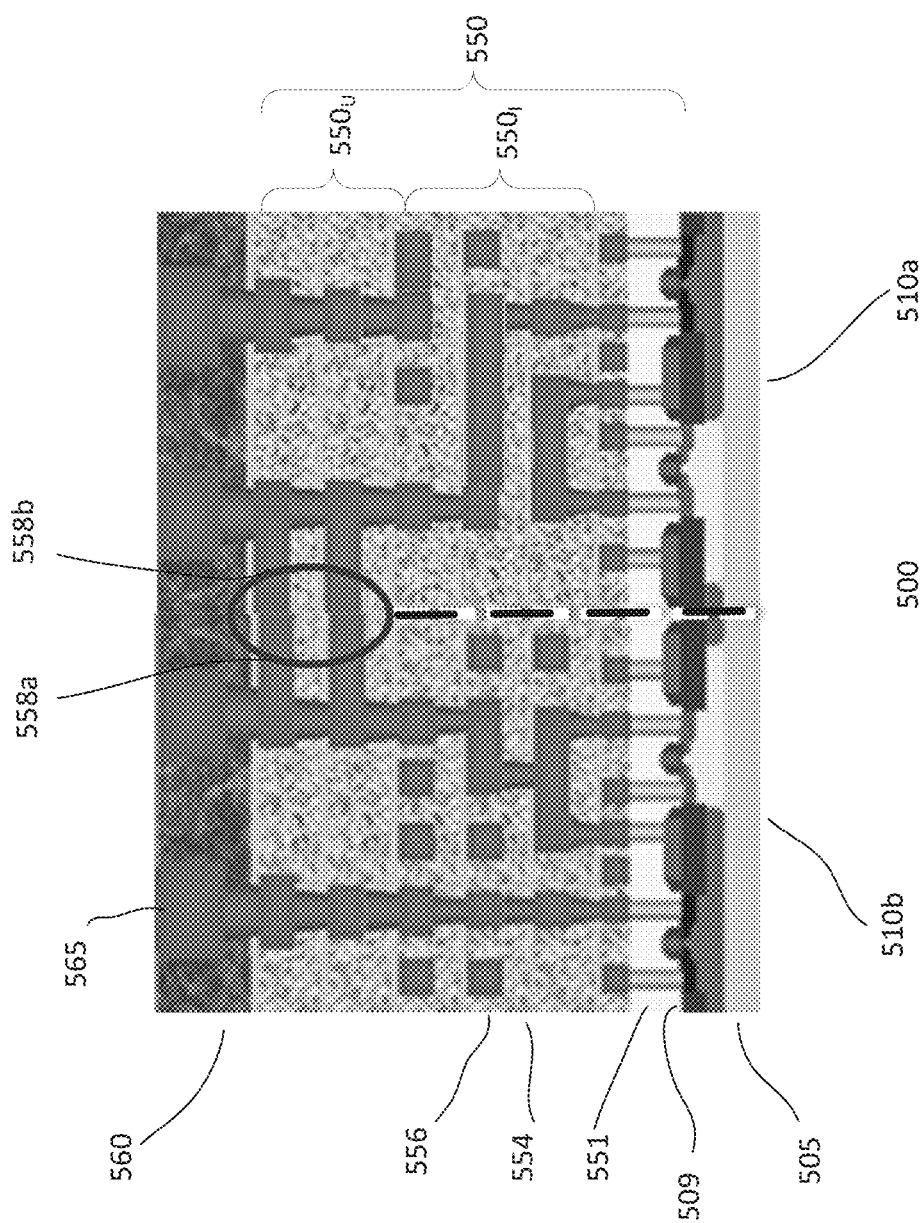
FIG. 5 shows another embodiment of a stitched device.

FIG. 5 shows a cross-sectional view of an embodiment of a portion of a stitched device 500. The stitched device includes N number of base devices. As shown, the stitched device includes first and second base devices 510a-510b. A base device, in one embodiment, is an IC. Other suitable numbers of base device and other suitable type of stitched devices may also be useful.

The device includes a substrate 505. The substrate, for example, may be a silicon substrate. The substrate can be lightly doped with p-type dopants. Other suitable types of semiconductor substrates may also be used. For example, the substrate may be silicon germanium, intrinsic or doped with other types of dopants or dopant concentrations. In some cases, the substrate may be a crystal-on-insulator (COI) substrate, such as a silicon-on-insulator substrate (SOI). Other types of COI or non-COI substrates may also be useful. The substrate may be a part of a wafer which is processed in parallel to form a plurality of stitched devices. The wafer may be diced to singulate the stitched devices.

The substrate, for example, may include a first major surface 509. The first surface, for example, is the active or the top surface. The substrate may include various types of regions. Such regions, for example, may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful.

Front end of line (FEOL) processing is performed on the substrate to form, for example, the components. FEOL processing may include forming isolation regions to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, forming gate oxide layer, such as thermal silicon oxide followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a LV transistor.

The gate layers, in one embodiment, may be formed on the active surface of the substrate. After the gate layers are formed on the active surface of the substrate, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask. Performing other processes may also be useful.

After forming transistors, back-end-of-line (BEOL) processing is performed. The BEOL process includes forming interconnects in interlevel dielectric (ILD) layers or levels 550. The interconnects connect the various components of the IC to perform the desired functions. An ILD layer includes a metal level 556 and a contact level 554. Generally, the metal level includes conductors or metal lines while the contact level includes contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as RIE, may also be employed to form the metal lines.

A device may include a plurality of ILD layers or levels. For example, x number of ILD levels may be provided. For example, 6 ILD levels (x=6) may be provided. Other number of ILD levels may also be useful. The number of ILD levels may depend on, for example, design requirements or the logic process involved. A metal level of an ILD level may be referred to as $M_i$, where i is in the $i^{th}$ ILD level of x ILD levels. A contact level of an ILD level may be referred to as where $V_{i-1}$, is the $i^{th}$ ILD level of x ILD levels. For the first contact level, it may be referred to as CA.

The BEOL process, for example, commences by forming a dielectric layer 551 over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. The first metal level M1 and CA may be referred as a lower ILD level.

The process continues to form additional ILD layers or levels. For example, the process continues to form intermediate and upper ILD levels $550_I$ and $550_U$. The intermediate ILD levels may include ILD level 2 to ILD level 4 while upper ILD levels include ILD levels 5 and 6. The intermediate and upper ILD levels may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the intermediate and upper ILD levels may be formed by dual damascene techniques. For example, vias and trenches are formed, creating dual damascene structures. The dual damascene structures may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductor and contacts in the ILD layer.

A dielectric liner may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The upper ILD levels may have different design rules, such as critical dimension (CD), from the intermediate or lower ILD levels. For example, the upper ILD levels, such as M5 and M6, may have a larger CD than the lower metal levels. For example, the upper ILD levels may have a CD which is 2X or more than the CD of the lower metal levels.

A pad level 560 is disposed over the uppermost ILD level. The pad level includes pad interconnects 565. For example, a pad interconnect is coupled to an interconnect in the top metal level Mx. The pad interconnects provide external connections to the device.

In one embodiment, stitching points for stitching the base devices together are provided in the upper ILD levels, as indicated by the circle. The stitching points are provided in corresponding levels of the base devices. For example, stitching points may be provided in M5 of the base devices. Providing stitching points in multiple corresponding levels of the base devices may also be useful. Locating the stitching points in upper ILD levels increases process window due the larger CD at these levels. Locating the stitching points at other levels may also be useful. In a stitched device, there may be numerous stitching points between base devices. A stitching point, for example, is a coupling point between interconnect 558a of the first base device and interconnect 558b of the second base device. In one embodiment, one of the two interconnects being stitched includes a stitch coupler to facilitate electrical connection between interconnects of the two base devices. The stitch coupler has increased width relative to the width of the other interconnect to be stitched. The width of the stitch coupler, for example, may be about 2 to 6 times wider than the line width. Providing a stitch coupler increases the coupling process window between interconnects of base devices at the stitching point. Including stitch couplers for both interconnects of the stitching point may also be useful.

Figure 6B:
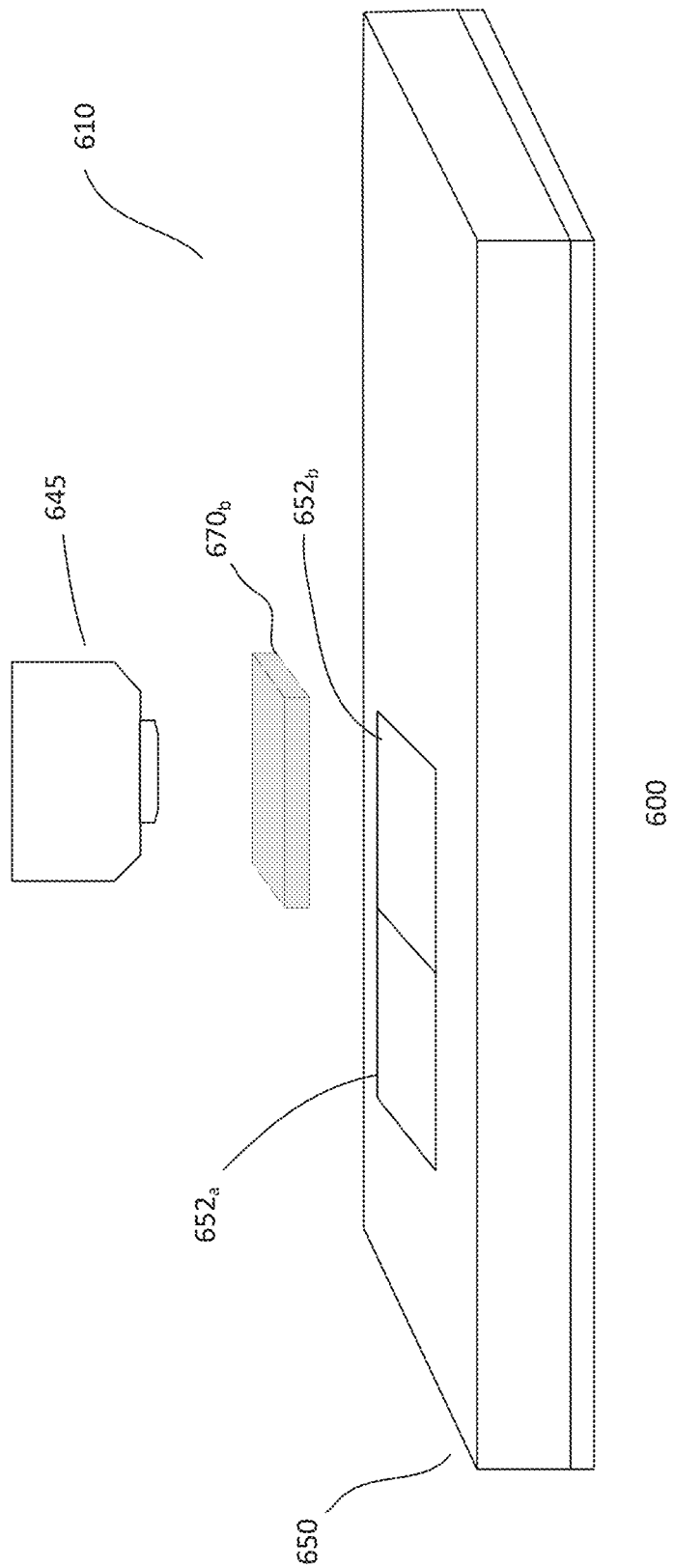

FIGS. 6a-6b illustrate an embodiment of a lithographic process 600 for forming a stitched device. Referring to FIG. 6a, a wafer 650 is mounted on a wafer platform or stage of a lithographic system 610. The substrate includes a photoresist layer. The lithographic system includes a projection lens 645 which projects a first image from a first reticle 670a onto a first position 652a on the wafer. This exposes the photoresist layer with the first reticle pattern in the first position. The first reticle, for example, may be from a first mask set for forming a first base device of the stitched device on the wafer. As shown in FIG. 6b, the wafer, after being exposed by the first reticle, is exposed by the lithographic system with an image from a second reticle 670b onto a second position 652b on the wafer. The second position is adjacent to the first position, enabling the base devices to be stitched.

In the case where the stitched device includes additional base devices, the substrate is exposed with the image of the additional base devices to complete exposing the stitched device. This process may be repeated for forming a plurality of stitched devices on the wafer in parallel. In other cases, the wafer is repeatedly exposed in first positions corresponding to first base and then repeatedly exposed in second positions corresponding to second base devices. For example, each base device is exposed in all respective locations on the wafer before the next base device. Other configurations of exposing the wafer with base devices may also be useful. After exposure, the resist layer is developed, transferring the pattern of the reticles onto the photoresist layer. The wafer may be processed as required. The exposure process may be repeated until all lithographic processes are performed to complete forming the stitched devices.

Figure 7B:
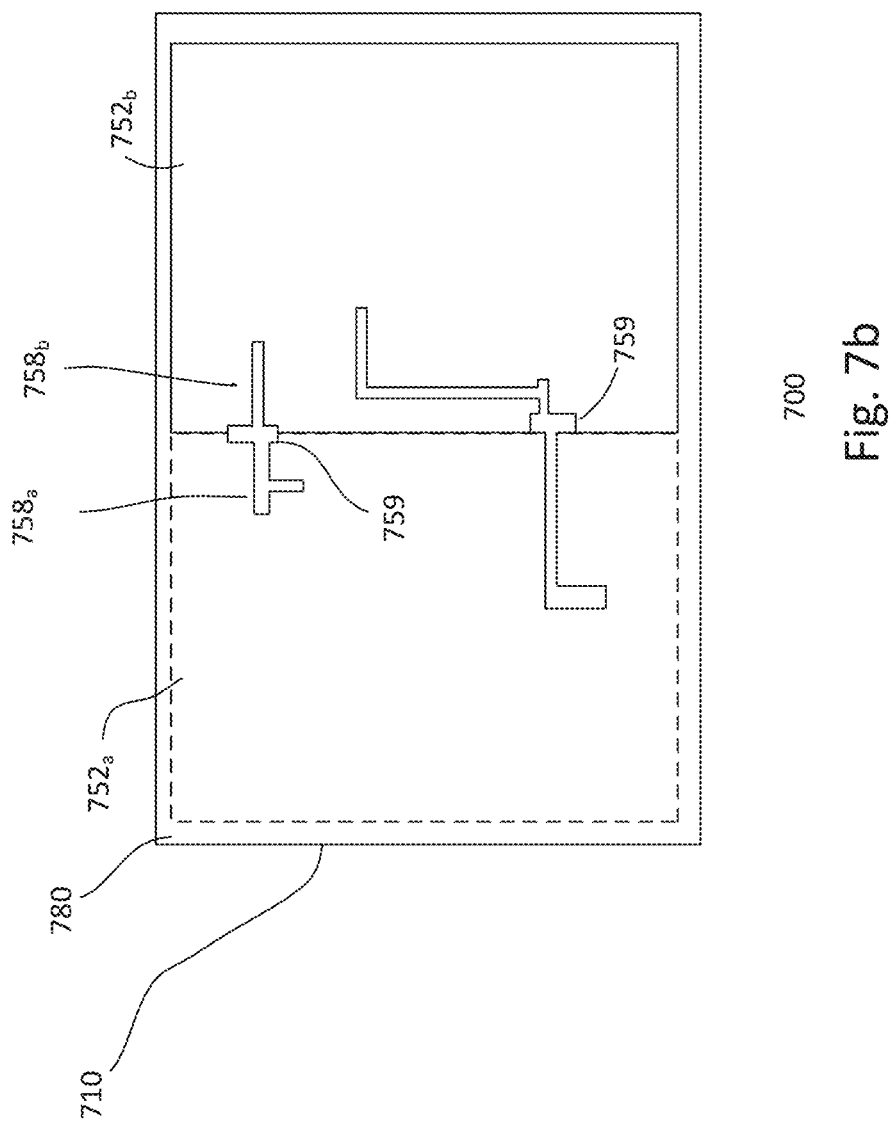

FIGS. 7a-7b illustrate an embodiment of a process 700 for forming a stitched device 710. Referring to FIG. 7a, first and second reticles 761a-761b corresponding to first and second base device of the stitched device are shown. The reticles correspond to a metal level of the base devices. In one embodiment, the metal level corresponds to metal levels for stitching the base devices. The first reticle includes patterns for interconnects 778a and the second reticle includes patterns for interconnects 778b. The patterns are designed for stitching the base devices together at stitching points. The reticle patterns are simplified reticle patterns. For example, the reticle patterns include two stitching points for illustration purposes. However, reticle patterns may include numerous stitching points.

In one embodiment, one of the interconnect pattern at the stitching point includes a stitch coupler 759. As show, the stitch coupler has a larger width relative to the other interconnect of the stitching point. It is not necessary that stitch couplers are provided to interconnects of one reticle. For example, stitch couplers may be provided to interconnects of both reticles.

Referring to FIG. 7b, the first and second reticles are used to expose a photoresist layer on a wafer surface. The resist layer is developed after exposure to transfer the first and second reticle patterns to the resist layer. As shown, the resist includes a first resist pattern 752a derived from the first reticle and a second resist pattern 752b derived from the second reticle. The first and second patterns are used to process the wafer to form an interconnect level of the stitched device. For example the resist pattern is used to form interconnects in a metal level of the stitched device. As shown, the adjacent edges of the first and second patterns abut, forming a common edge. This results in stitching interconnects 758a and 758b of the first and second base devices from processing the wafer.

A channel region 780 surrounds the first and second base patterns. However, no channel is disposed between the base patterns due to the abutment of the first and second patterns. In one embodiment, stitching is achieved by shifting the wafer platform towards the position of the second reticle image. Alternatively, stitching is achieved by shifting the projection lens towards the position of the first reticle image. For example, the distance shifted is equal to about the width of the dicing channel. The distance, for example, may be about 50-100 μm. The distance, for example, may depend on the width of the dicing channel. This results in the adjacent edges of first and second reticle patterns being contiguous, stitching the interconnect patterns, as shown.

FIGS. 8a-8b illustrate an embodiment of a stitched device 800 at different levels. Referring to FIG. 8a, the device depicts lower or non-stitching levels of the stitched device. For example, this may relate to FEOL and/or lower levels 838 of the stitched device. As shown, the stitched device includes first and second base devices 810a-810b. Separating the base devices at the non-stitching level is a dicing channel 835. For example, the lithographic process in these levels is similar to that used in conventional non-stitched devices. The lower stitched level are shown as blanks for purpose of illustration. It is understood that these levels include patterns.

Referring to FIG. 8b, a stitched level 848 of the stitched device is shown. In one embodiment, reticles of the base devices used for a stitched level are slightly larger. For example, an edge of the reticle of a base device which is adjacent to another base device is slightly increased. A base device may have more than one edge which is adjacent to another base device. Edges which are not adjacent to another base device may also be increased. Other configurations of reticle edges may also be useful. The increase, for example, is about half the width of the channel width. For example, the increase may be about 25-50 μm. Other width increase may also be useful, depending on the channel width. This results in the adjacent sides of the base devices abutting, causing the interconnects 858a and 858b to connect at stitching points. In one embodiment, one of the interconnect pattern at a stitching point includes a stitch coupler 859. As show, the stitch coupler has a larger width relative to the other interconnect of the stitching point. By increasing the width of the adjacent side of the reticle, no additional shifting other than normal shifting of the wafer platform or projection lens is necessary to stitch the based devices.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A stitched device comprising:
a wafer having first and second major surfaces, wherein the wafer includes
a first base device of the stitched device, wherein the first base device includes a first adjacent side, and
a second base device of the stitched device, wherein the second base device includes a second adjacent side, wherein the first and second adjacent sides are common sides of the first and second base devices;
a stitching level disposed on the first major surface of the wafer, wherein the stitching level covers the first and second base devices of the stitched device, wherein the stitching level is an interconnect level of the stitched device;
first interconnects of the first base device disposed in the stitching level, wherein the first interconnects have a first pattern which includes first stitching points located at the first adjacent side of the first base device; and
second interconnects of the second base device disposed in the stitching level, wherein the second interconnects have a second pattern which includes second stitching points located at the second adjacent side of the second base device, wherein the first and second interconnects are electrically coupled at the first and second stitching points to form stitched interconnects which electrically couple the first and second base devices.

2. The device of claim 1 wherein the stitched device comprises a stitched integrated circuit with stitched first and second base integrated circuit devices.

3. The device of claim 2 wherein the stitched device comprises additional base devices.

4. The device of claim 2 wherein the stitched device comprises a plurality of stitching levels in a plurality of interconnect levels.

5. The device of claim 2 wherein the stitching level comprises an upper interconnect level with larger design rules.

6. The device of claim 1 wherein the stitched device comprises an interposer with stitched first and second base interposers.

7. The device of claim 6 wherein the stitched interposer comprises additional base interposers.

8. The device of claim 6 wherein the stitching level comprises an interconnect level of a redistribution layer.

9. The device of claim 8 wherein the stitched device comprises a plurality of stitching levels in a plurality of interconnect levels.

10. The device of claim 1 wherein one of the first and second interconnects at the stitching point comprises a stitch coupler, wherein the stitch coupler has a larger width than a width of the interconnects.

11. The device of claim 10 wherein the first and second interconnects at the stitching point comprise stitch couplers.

12. The device of claim 10 wherein the stitching level comprises a plurality of stitching points for coupling a plurality of first interconnects to a plurality of second interconnects.

13. A stitched device comprising:
a wafer having first and second major surfaces, wherein the wafer includes
a first base device of the stitched device, wherein the first base device includes a first adjacent side, and
a second base device of the stitched device, wherein the second base device includes a second adjacent side, wherein the first and second adjacent sides are common sides of the first and second base devices;
a stitching level disposed on the first major surface of the wafer, wherein the stitching level covers the first and second base devices of the stitched device, wherein the stitching level is an interconnect level of the stitched device;
first interconnects of the first base device disposed in the stitching level, wherein the first interconnects have a first pattern which includes at least one first stitching point located at the first adjacent side of the first base device; and
second interconnects of the second base device disposed in the stitching level, wherein the second interconnects have a second pattern which includes at least one second stitching point located at the second adjacent side of the second base device, wherein the first interconnect at the at least one first stitching point is electrically coupled to the second interconnect at the at least one second stitching point.

14. The device of claim 13 wherein the stitched device comprises a plurality of stitching levels in a plurality of interconnect levels.

* * * * *